United States Patent [19]
Eklund

[11] Patent Number: 5,811,860
[45] Date of Patent: Sep. 22, 1998

[54] BI-CMOS MERGED DEVICES

[75] Inventor: Robert Howard Eklund, Plano, Tex.

[73] Assignee: Texas Instruments Incorporated, Dallas, Tex.

[21] Appl. No.: 431,232

[22] Filed: Apr. 28, 1995

Related U.S. Application Data

[62] Division of Ser. No. 161,960, Dec. 3, 1993, Pat. No. 5,441,903.

[51] Int. Cl.$^6$ .......................... H01L 29/76; H01L 29/94; H01L 27/082; H01L 23/48
[52] U.S. Cl. ..................... 257/370; 257/378; 257/413; 257/588; 257/754; 257/755
[58] Field of Search ................... 257/370, 378, 257/588, 754, 755, 413

[56] References Cited

U.S. PATENT DOCUMENTS

| | | | |
|---|---|---|---|
| 4,868,135 | 9/1989 | Ogura et al. ............................ | 257/370 |
| 5,031,020 | 7/1991 | Momose .................................. | 357/46 |
| 5,101,257 | 3/1992 | Hayden et al. ......................... | 357/23.4 |
| 5,334,549 | 8/1994 | Eklund .................................... | 437/44 |

OTHER PUBLICATIONS

Rovedo et al., Process Design for Merged Complementary BiCMOS, IEEE 1990, pp. 485–488.

*Primary Examiner*—Steven H. Loke
*Attorney, Agent, or Firm*—Mark A. Valetti; W. James Brady; Richard L. Donaldson

[57] ABSTRACT

A merged BiCMOS device 10 having a bipolar transistor 60 and a PMOS transistor 64 formed in the same well region 18. Bipolar transistor 60 is comprised of an emitter electrode 30, base region 26, and collector region formed by well region 18. Emitter electrode 30 is separated from base region 26 by thick oxide 24. Tungsten-silicide layer 32 covers emitter electrode 30. PMOS transistor 64 comprises source/drain regions 52 and 52$a$, gate electrode 40, and gate oxide 36. PMOS transistor 64 may optionally comprise LDD regions 44. Source/drain region 52$a$ is in contact with base region 26. If desired, the emitter electrode 30 and gate electrode 40 may be silicided.

2 Claims, 6 Drawing Sheets

BI-CMOS MERGED DEVICES

This is a division of application Ser. No. 08/161,960, filed on Dec. 3, 1993, now U.S. Pat. No. 5,441,903.

CROSS REFERENCE TO RELATED APPLICATIONS

The following co-assigned patent application is hereby incorporated by reference:

| Ser. No. | Filing Date | TI Case No. |
| --- | --- | --- |
| 08/106,458 | 08/13/93 | TI-17015 |

FIELD OF THE INVENTION

This invention generally relates to semiconductor processing and more specifically to BiCMOS processes.

BACKGROUND OF THE INVENTION

The integration of MOSFET structures and bipolar transistors on a single substrate has become very desirable. As is well known in the art, digital and linear functions are often performed by integrated circuits using either bipolar or metal-oxide semiconductor (MOS) technology. Bipolar integrated circuits, of course provide higher speed operation and greater drive currents than the MOS circuits, at the cost of higher power dissipation, especially when compared against complementary MOS (CMOS) circuits. Advances in manufacturing technology have allowed the use of both bipolar and CMOS transistors in the same integrated circuit (commonly referred to as BiCMOS devices). Bipolar transistors are typically formed by using a moat region for the base of the bipolar transistor, doped polysilicon for the emitter, and a well region for the collector. Additional moat regions are then used to form any source/drain regions of PMOS transistors. Further exploitation of the high current driving capabilities of the bipolar transistor is important to obtaining even higher levels of bipolar or merged bipolar CMOS integration.

SUMMARY OF THE INVENTION

A BiCMOS device comprising a bipolar transistor and a PMOS transistor located in the same well region is disclosed. The bipolar transistor has an emitter electrode comprising a layer of polysilicon and a layer of tungsten-silicide. The device may be formed by first forming an insulator layer over a surface of a semiconductor body. Then a base region is implanted in a first portion of a well region. The first insulator layer is then etched to expose a portion of the base region. A doped conductive layer is formed over the surface of the semiconductor body and a tungsten-silicide layer is deposited over the doped conductive layer. Next, the tungsten-silicide layer and the doped conductive layer are etched to form an emitter electrode. Finally, a plurality of PMOS transistors are formed, wherein at least one of the PMOS transistors has a first source/drain region formed in the well region and in contact with said base region.

An advantage of the invention is providing a simplified process forming a merged BiCMOS device.

A further advantage of the invention is providing a merged bipolar/PMOS structure that comprises a $WSi_2$ layer which prevents the p+ S/D implant from altering the bipolar transistor gain by blocking the p+ S/D implant from the emitter polysilicon.

A further advantage of the invention is providing a BiCMOS device having an emitter electrode capping layer which can withstand high temperature oxide growth.

These and other advantages will be apparent to those of ordinary skill in the art having reference to this specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The preferred embodiment of the invention is described herein as incorporated into a BiCMOS structure having a bipolar transistor and a PMOS transistor merged into the same well region.

Figure 1:
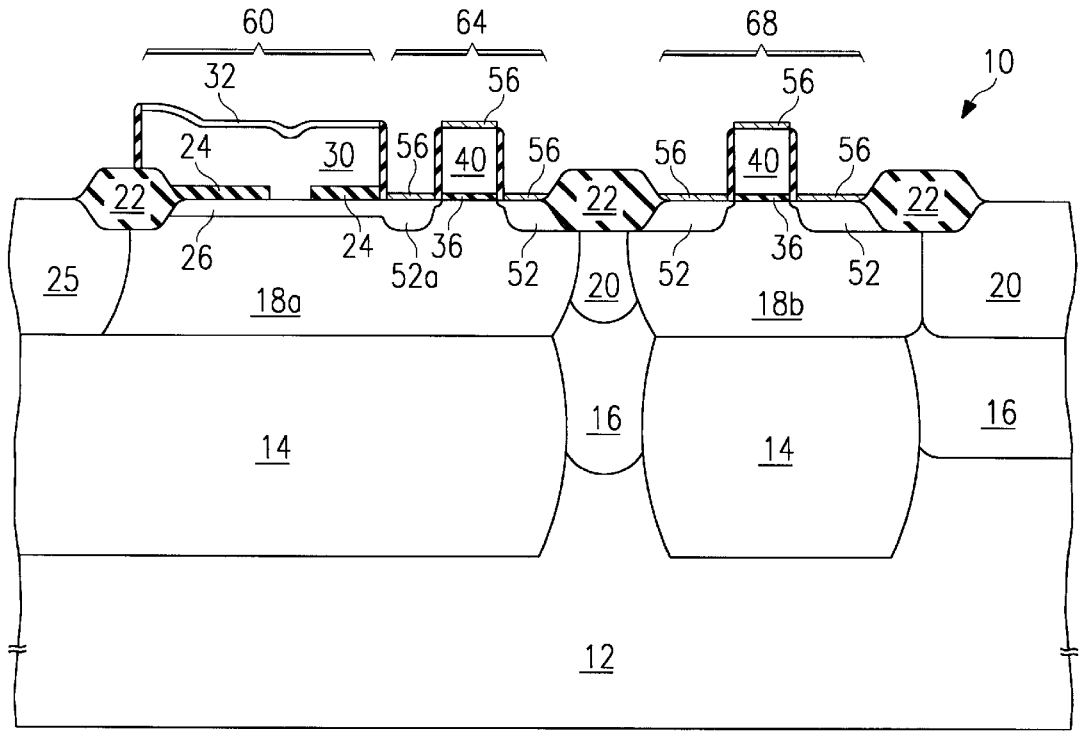
FIG. 1 is a cross-sectional diagram of the preferred embodiment of the invention.

FIG. 1 illustrates, in cross-section, bipolar transistor 60 and p-channel transistors 64 and 68. The structure is formed into a substrate 12 which, in this embodiment is p-type silicon. Buried n+ region 14 in bipolar transistor 60 serves as a subcollector, in the conventional manner, with n+ region 25 providing a surface contact thereto. N region 18a serves as the collector region in bipolar transistor 60 and as the well region for p-channel transistors 64. N region 18b is the well region for p-channel transistor 68. Intrinsic base 26 is a p-type region disposed within n region 18a. Emitter electrode 30 may be a doped polysilicon layer which extends through an opening in insulator layer 24 to intrinsic base region 26. Tungsten-silicide layer 32 covers emitter electrode 30. P+ region 52a serves as both the extrinsic base region of bipolar transistor 60 and as one of the source/drain regions for p-channel transistor 64. P+ regions 52 serve as the remaining source/drain regions for p-channel transistors 64 and 68. Doped polysilicon may be used to form gates 40 of transistors 64 and 68. Gate oxide 36 is disposed between gates 40 and n regions 18. Buried region 16 is located below region 20. Field insulating regions 22 isolate intrinsic base region 26 from collector contact 25 and p-channel transistors 64 and 68 from each other. Gates 40 may optionally be silicided to form $TiSi_2$ layer 56. N+ regions 14 below transistors 64 and 68 are separated by buried p region 16 and n regions 18a–b are separated by p region 20 to allow the n-type regions 18a–b of the two transistors to be at different potentials.

Figure 2A:
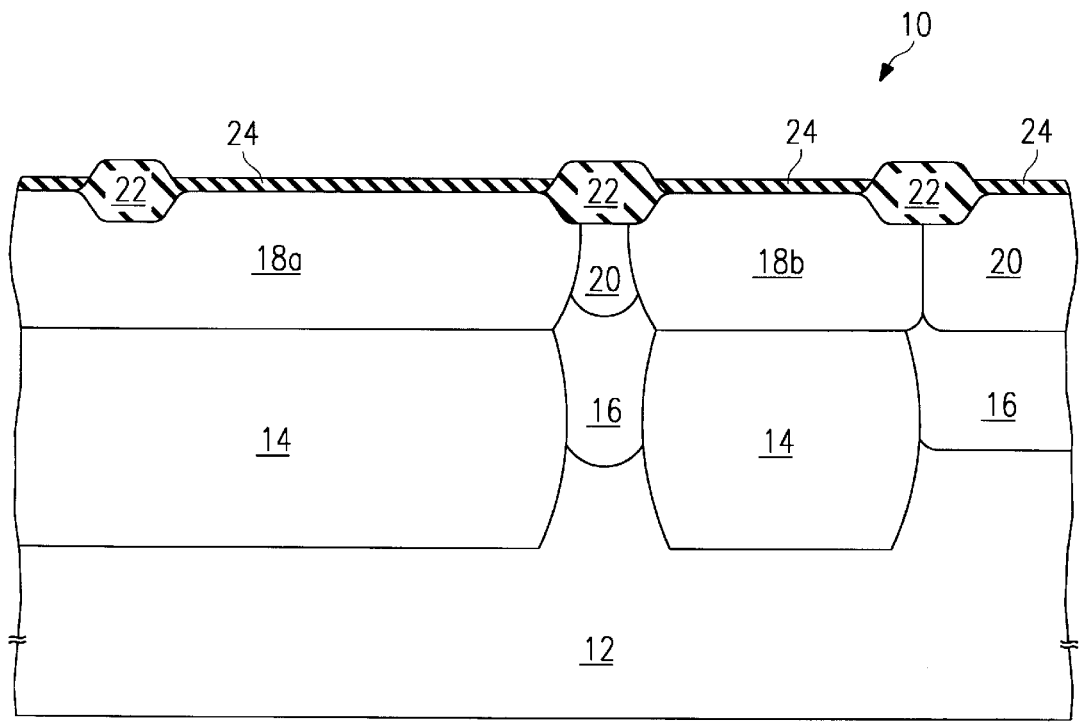
FIGS. 2a–j are cross-section diagrams showing various stages of fabrication of the preferred embodiment of the invention.

FIG. 2a illustrates structure 10 after the formation on n+ buried layers 14, p buried layers 16, n-type regions 18a–b, p-type regions 20, field insulating regions 22, and insulator layer 24. Methods for forming the buried layers are described in U.S. Pat. No. 4,958,213, issued Sep. 18, 1990 and assigned to Texas Instruments Incorporated. A method for forming field insulating regions 22 is described in U.S. Pat. No. 4,541,167, issued Sep. 17, 1985 and assigned to Texas Instruments Incorporated. Insulator layer 24 may be a dummy gate oxide formed via an Anti Kooi oxidation followed by a deglaze to a thickness of less than 20 Å followed by a thermal oxidation to a thickness on the order of 300 Å. The formation of a merged BiCMOS device according to the invention into the structure of FIG. 2a will now be described.

Figure 2B:
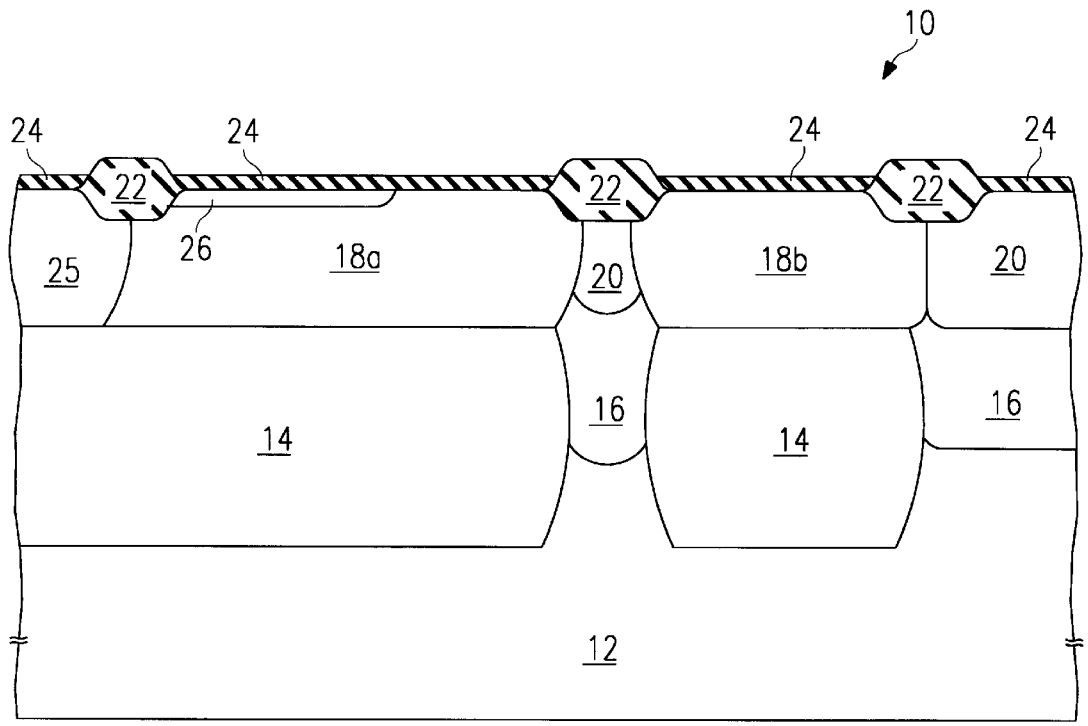

The surface of structure 10 is patterned and implanted using a n-type dopant form a deep n-type region (collector contact 25) that extends through n region 18 to contact the subcollector, n+ region 14, as shown in FIG. 2b. Next, the $V_t$ adjust implants may be performed: one for NMOS transistors (not shown) and one for PMOS transistors 64 and 68. Still referring to FIG. 2b, the base region 26 is patterned and implanted with a p-type dopant (e.g. boron 7.0E13 cm at 10 Kev).

Figure 2C:
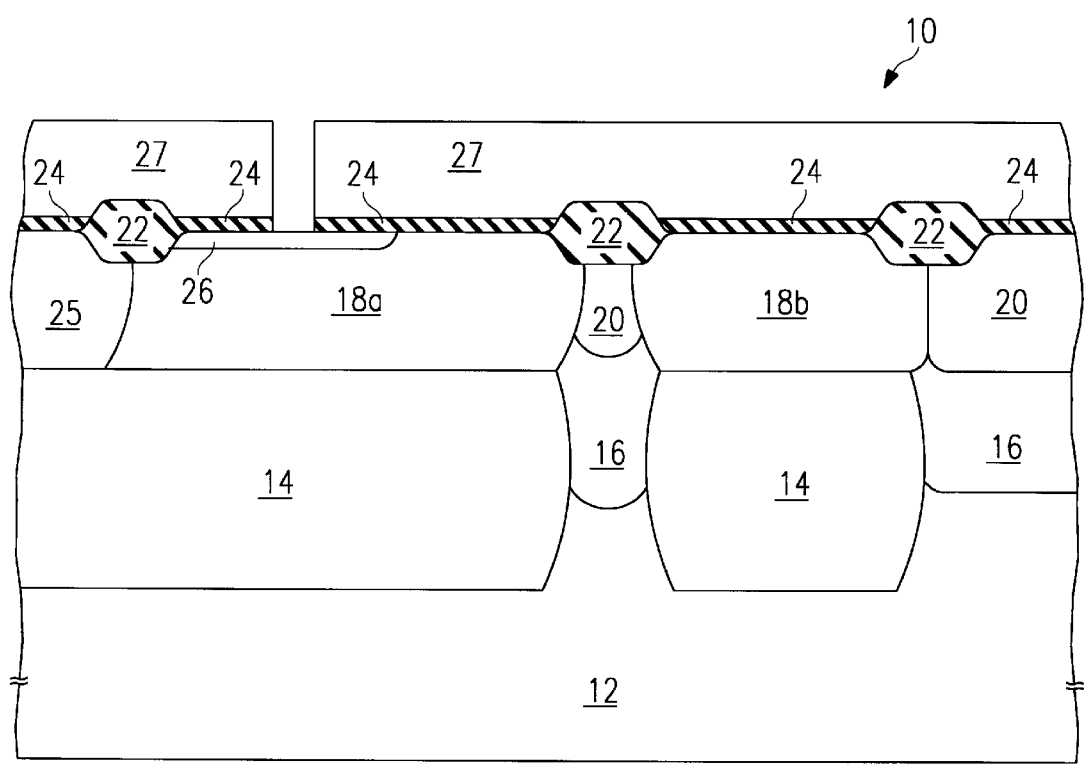
Figure 2D:
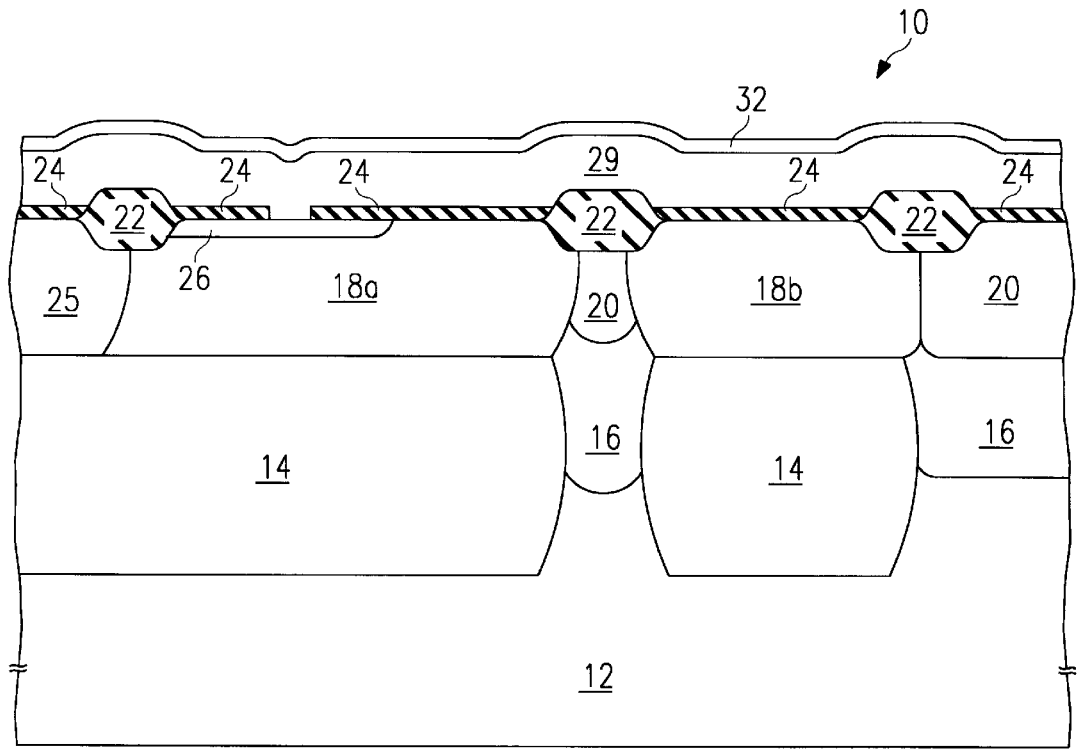
Figure 2E:
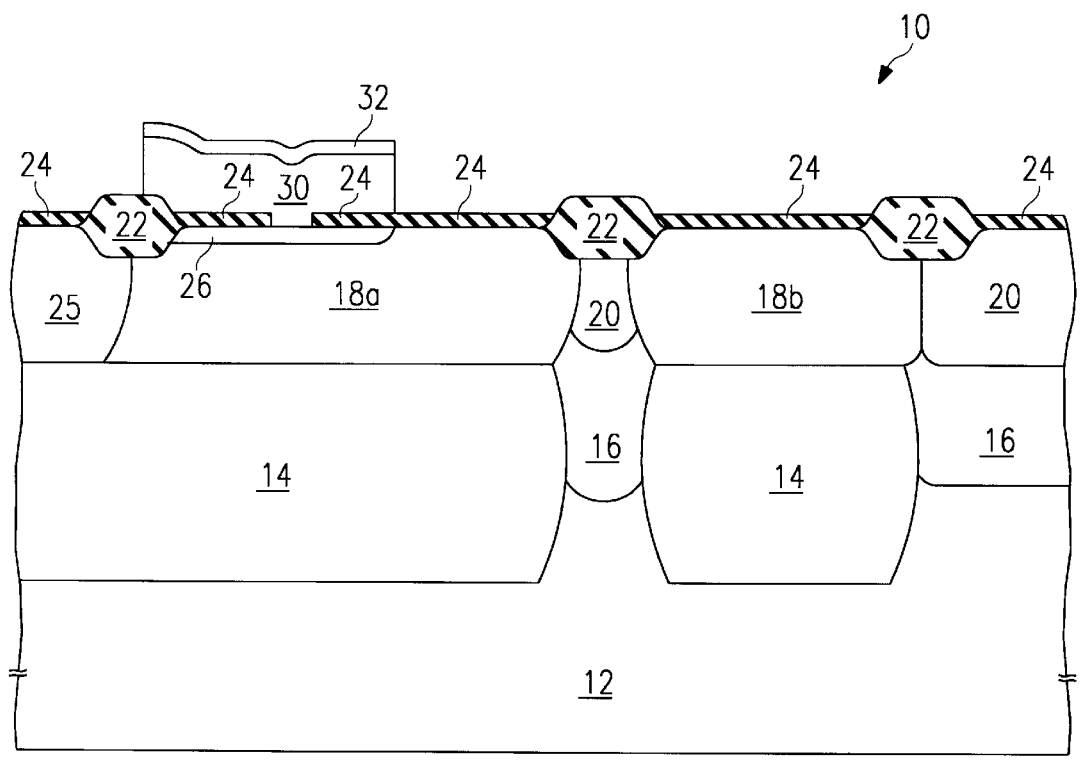

Referring to FIG. 2c, masking layer 27 is used to expose a region of dummy oxide layer 24. The exposed oxide is then etched to expose a portion of base region 26. Masking layer 27 is then removed and a deglaze is performed (e.g., 10% HF for 10 seconds) to minimize the interfacial oxide. Referring to FIG. 2d, a layer of conductive material, such as polysilicon layer 29, is deposited to a thickness on the order of 2500 Å. Next, polysilicon layer 29 may be doped n-type via ion implantation. Alternatively, the polysilicon may be doped in-situ during deposition. A layer of tungsten silicide $WSi_2$ 32 is deposited over polysilicon layer 29. $WSi_2$ 32 may have a thickness on the order of 500 Å or greater. Next, $WSi_2$ layer 32 is annealed. Polysilicon layer 29 and $WSi_2$ 32 are then patterned and etched as shown in FIG. 2e to form emitter electrode 30. $WSi_2$ layer 32 prevents oxidation of emitter electrode 30 during subsequent processing steps.

Figure 2F:
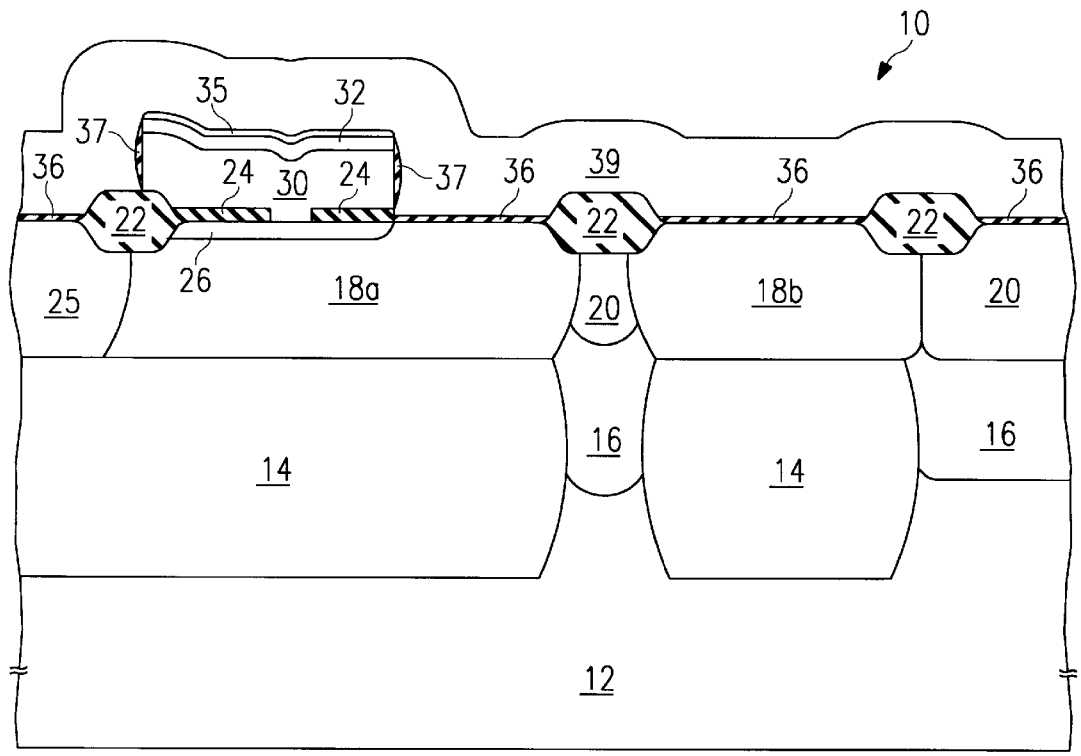
Figure 2G:
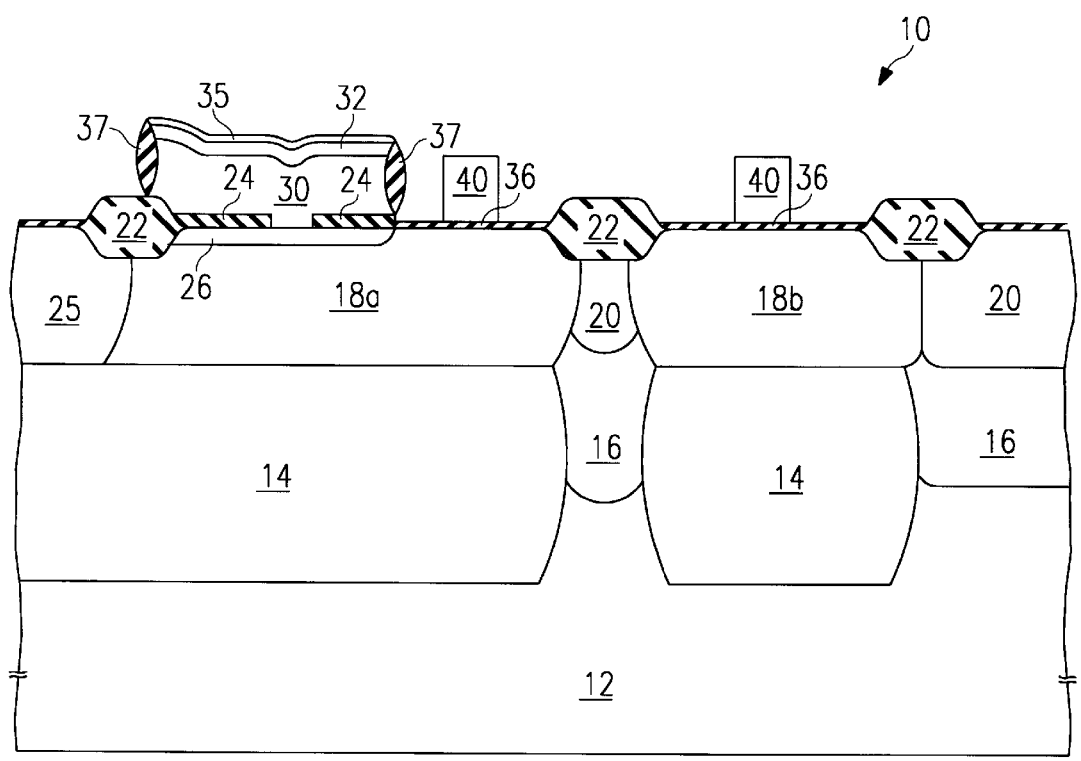

Referring to FIG. 2f, the exposed portions of dummy oxide layer 24 are then removed using a deglaze and replaced with an insulator layer such as gate oxide layer 36. Gate oxide layer 36 maybe formed by thermal oxidation and have a thickness on the order of 100 Å. During the growth of gate oxide layer 36, oxide 37 will form on the vertical edges of emitter electrode 30 and silicon dioxide layer 35 will form on $WSi_2$ 32, as shown in FIG. 2f. The thermal oxidation maybe performed at a temperature high enough to also serve as the emitter anneal. In the preferred embodiment a temperature on the order of 900° is used. A second layer of conductive material, such as polysilicon layer 39, is deposited by way of LPCVD over the surface of structure 10, as shown in FIG. 2f. Polysilicon layer 39 has a thickness on the order of 3500 Å. Polysilicon layer 39 may then be doped via ion implantation. Alternatively, polysilicon layer 39 may be doped by other means such as in situ doping or gas phase doping (with for example $POCl_3$) as is well known in the art. Polysilicon layer 39 is patterned and etched to form gates 40, as shown in FIG. 2g. Silicon dioxide layer 35 will serve as an etchstop during the polysilicon gate etch.

Figure 2H:
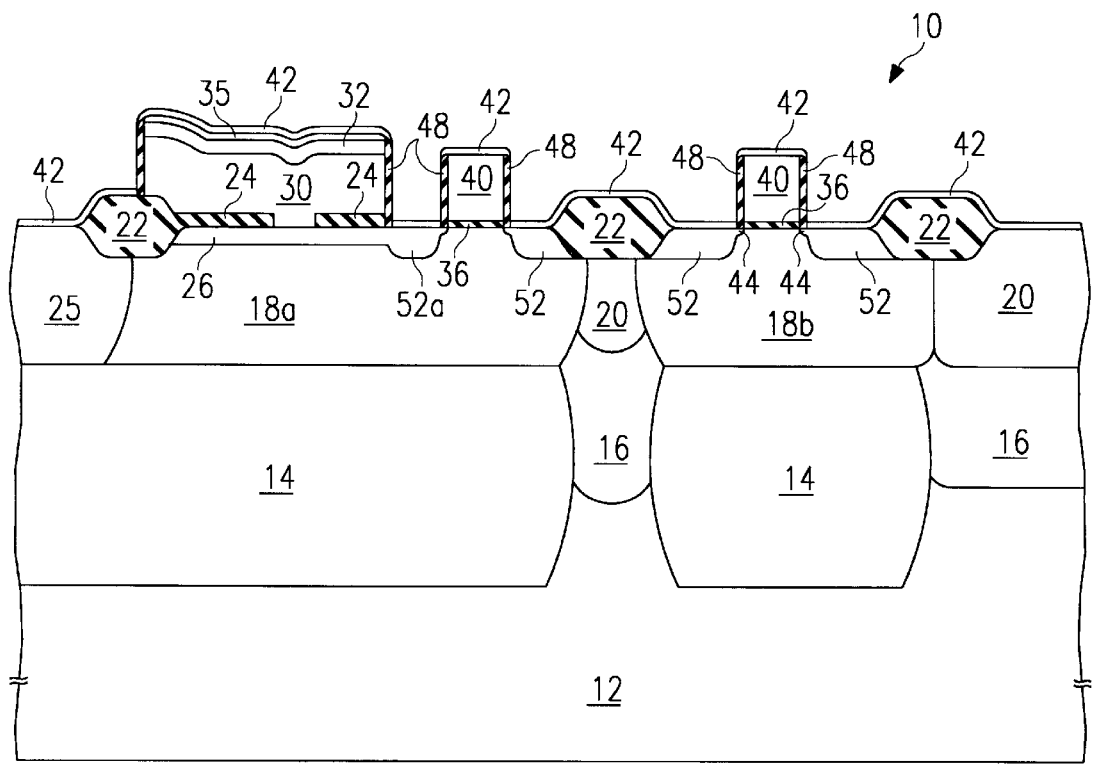
Figure 2I:
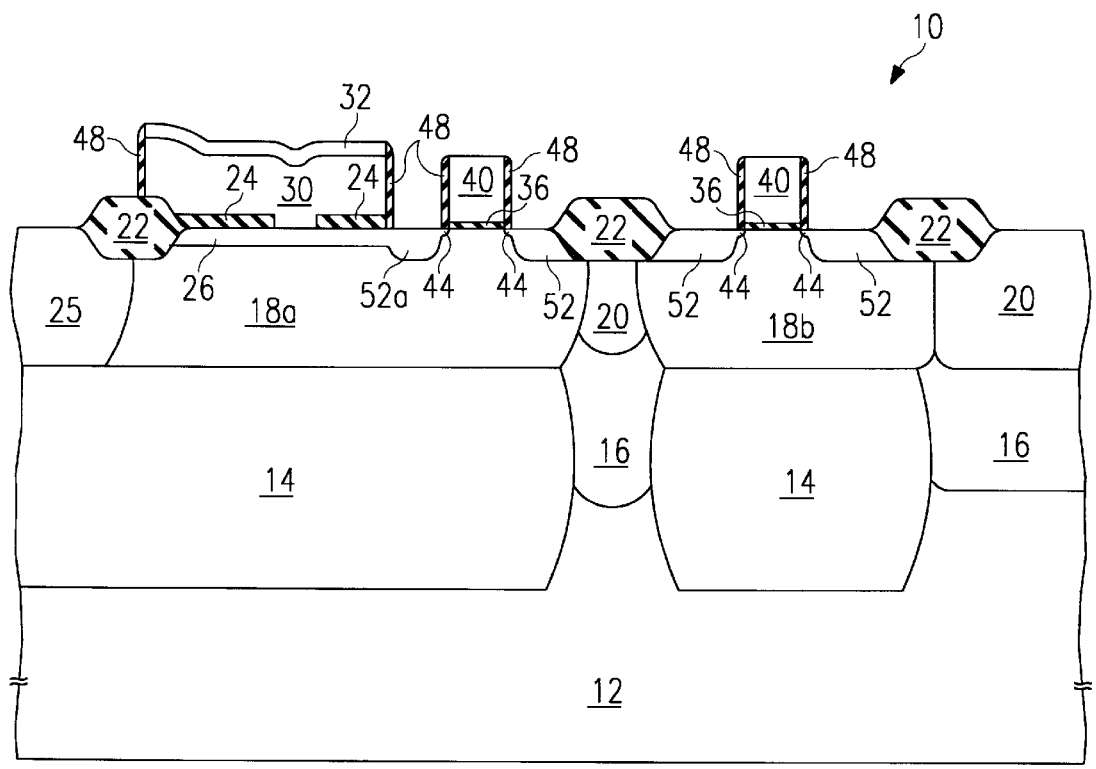

Referring to FIG. 2h, a layer of tetraethoxysylane (TEOS) 42 is deposited over the surface. Conventional techniques are then used to implant lightly doped drains (LDDs) 44, form sidewall spacers 48, and form source/drain regions 52. It should be noted that LDDs 44 are optional and need not be formed. Sidewall spacers 48 may be formed by depositing a dielectric layer and anisotropically etching the dielectric layer. Sidewall spacers 48 preferably comprise silicon nitride. However, oxide or disposable polysilicon may alternatively be used. After sidewall spacers 48 are formed, source/drain regions 52 are implanted and annealed. Because the doped emitter electrode was previously "annealed" during the formation of oxide layer 36, source/drain regions 52 may be annealed at lower temperatures (on the order of 850° C.) thereby reducing short channel effects. TEOS layer 42 and silicon dioxide layer 35 are then removed as shown in FIG. 2i.

Figure 2J:
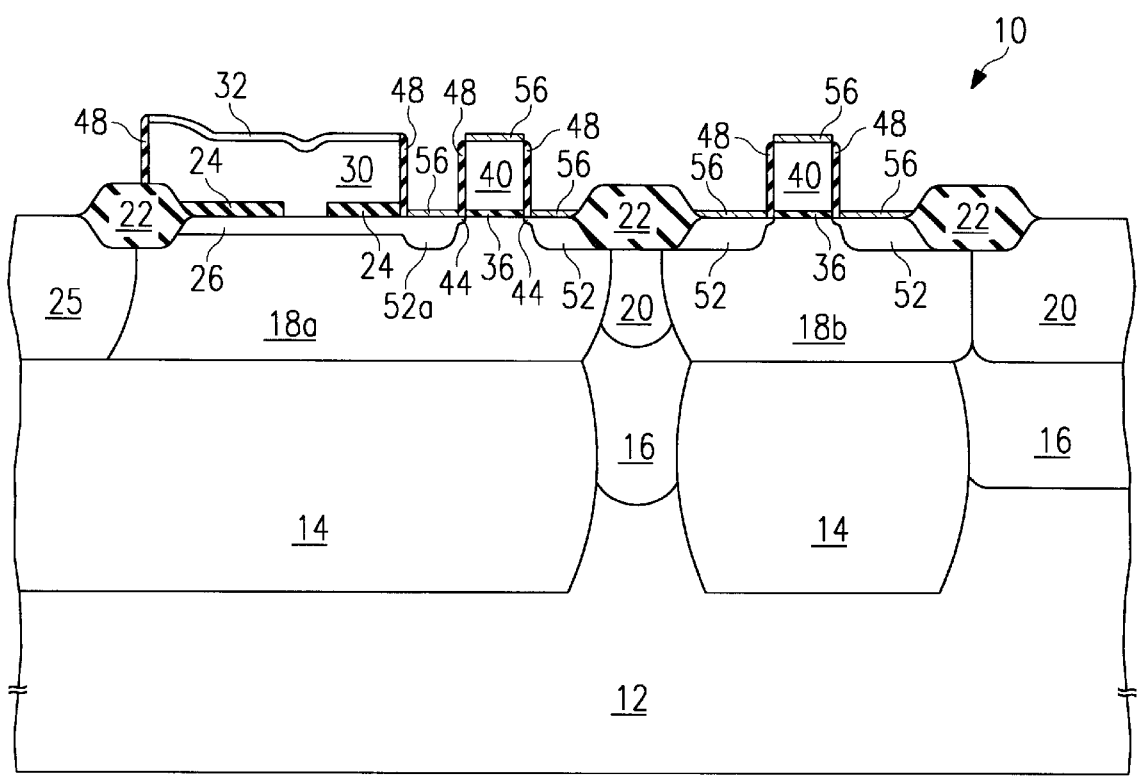

Next, the gates 40 and source/drain regions 52 and 52a may be silicided. A layer of refractory metal (not shown) is deposited over the surface of structure 10. The structure is annealed using a rapid thermal anneal, or alternatively a furnace anneal, in a nitrogen-containing ambient. This causes the layer of refractory metal to react with any exposed silicon to form silicide. Referring to FIG. 2j, silicide layer 56 is formed above gates 40 and source/drain regions 52 and 52a. Elsewhere, a layer of refractory metal-nitride and/or unreacted metal (not shown) is formed. The layer of refractory metal-nitride is then removed.

Subsequent to the completion of the methods described above, interconnecting metallization is then formed for making contact to the active regions of FIG. 1. Methods for forming such interconnections are well known in the art. Individual circuits are then separated from portions of substrate 12 and external connections made thereto by way of wire bonding, direct bump bonding, or the like, as is well known in the art. The individual circuits may then be packaged into a dual-in-line package, a chip carrier, or another type of package. An example of such a package is described in U.S. Pat. No. 4,495,376 issued Jan. 22, 1985 and assigned to Texas Instruments, Inc.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A BiCMOS device comprising:

a. a well region;

b. a bipolar transistor having an emitter electrode comprising a layer of polysilicon and a layer of tungsten-silicide located in said well region; and c. a PMOS transistor located in said well region, said PMOS transistor having a gate comprising polysilicon with an overlying layer of silicide other than tungsten-silicide.

2. The BiCMOS device of claim 1, wherein said PMOS transistor has a source/drain. region in contact with a base region of said bipolar transistor.

* * * * *